(12) United States Patent
Noro et al.

(10) Patent No.: US 6,448,856 B2
(45) Date of Patent: Sep. 10, 2002

(54) ELECTRONIC VOLUME CIRCUIT

(75) Inventors: Masao Noro; Nobuaki Tsuji, both of Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 09/773,646

(22) Filed: Jan. 31, 2001

(30) Foreign Application Priority Data

Feb. 4, 2000 (JP) ........................................ 2000-028152

(51) Int. Cl.⁷ ................................................ H03G 3/10
(52) U.S. Cl. ........................ 330/284; 330/69; 330/144; 381/104; 327/330
(58) Field of Search ............................ 330/69, 86, 133, 330/134, 297, 144, 284; 381/104, 120; 327/330

(56) References Cited

U.S. PATENT DOCUMENTS

| | | | | |
|---|---|---|---|---|
| 4,216,434 A | * | 8/1980 | Wermuth | ..................... 330/86 |
| 4,491,800 A | * | 1/1985 | Miyata | ..................... 330/51 |
| 5,034,699 A | * | 7/1991 | Powell | ..................... 330/86 |
| 5,233,309 A | * | 8/1993 | Spitalny et al. | ................. 330/84 |
| 6,016,352 A | * | 1/2000 | Barmore | ..................... 381/94.5 |

* cited by examiner

Primary Examiner—Robert Pascal
Assistant Examiner—Henry Choe
(74) Attorney, Agent, or Firm—Pillsbury Winthrop LLP

(57) ABSTRACT

An electronic volume circuit is provided, which can be driven by a single power source and can therefore be formed by an LSI that can be fabricated in a simple manner using an oxide film and a junction process for a single power source. A first amplifying circuit attenuates the amplitude of a bipolar input signal and converts the attenuated input signal to a unipolar signal, and a variable resistor device controls the degree of attenuation of the first amplifying circuit based on an externally supplied signal.

6 Claims, 5 Drawing Sheets

ELECTRONIC VOLUME CIRCUIT

BACKGROUND OF THE INVENTION

1. Field of the Invention

This invention relates to electronic volume circuits for electrically adjusting signal levels and particularly, to an electronic volume circuit that can be driven at a low voltage and by a single power source.

2. Prior Art

Latest versions of volumes for audio equipment and the like are designed to implement remote control by adding a motor-driven shaft rotating function to conventional volumes that are operated by manually rotating the shafts of rotary variable resistors. The volumes of this type are generally provided with as many rotary variable resistors as the number of output channels, which are mechanically linked with each other. To adjust the sound volume of signals involving many channels such as surrounding music, the number of rotary variable resistors for linkage needs to be increased with an increase in the number of channels. When the number of rotary variable resistors for linkage increases, larger torque is required to rotate these resistors, thus increasing not only power for driving the motor but also the size of the volume itself. It is also difficult to operate all the rotary variable resistors for linkage with identical characteristics. To overcome these problems, electronic volumes have been developed and commercialized, which are designed to adjust sound volume by means of an electronic circuit.

FIG. 1 is a block diagram showing an example of the arrangement of a conventional electronic volume circuit. In the figure, the electronic volume circuit includes input terminals 1 and 2, series-connected resistors 6 having the same resistance value with each other, a multiplexer 7, a control circuit 8, and an amplifier 9. An input signal Si is supplied to the electronic volume circuit via the input terminal 1 and a DC cutoff capacitor 4. The multiplexer 7 selects voltages at the junctions between the resistors 6 based on 8-bit control data from the control circuit 8, and outputs the selected voltages to the amplifier 9. The amplifier 9, which is driven by two power sources of ±5V, amplifies the selected voltages from the multiplexer 7 at an amplification factor determined by the values of resistors 10 and 11, and outputs the amplified voltages through an output terminal 12. The control circuit 8 converts volume control data (serial data) supplied through a terminal 13 into parallel data, and delivers the parallel data to the multiplexer 7.

The above described conventional electronic volume circuit requires two power sources of ±5V. Therefore, a power circuit for such power sources is more complicated than that for a single power source, and if the electronic volume circuit is formed of an LSI, a complicated process is required for fabricating such an LSI.

SUMMARY OF THE INVENTION

This invention has been made in view of these circumstances, and an object thereof is to provide an electronic volume circuit that can be driven by a single power source and can therefore be formed by an LSI that can be fabricated in a simple manner using an oxide film and a junction process for a single power source.

To attain the above object, the present invention provides an electronic volume circuit comprising a first amplifying circuit that attenuates amplitude of a bipolar input signal and converts the attenuated input signal to a unipolar signal, and a variable resistor device that controls a degree of attenuation of the first amplifying circuit based on an externally supplied signal.

According to this construction, the electronic volume circuit can be driven by a single power source, and can therefore be formed by an LSI that can be fabricated in a simple manner using an oxide film and a junction process for a single power source.

In a preferred form of the present invention, the electronic volume circuit according to the present invention comprises a first amplifying circuit that attenuates amplitude of a bipolar input signal and converts the attenuated input signal to a unipolar signal, a variable resistor device that controls a degree of attenuation of the first amplifying circuit based on an externally supplied signal, and a second amplifying circuit that amplifies an output from the first amplifying circuit and converts the amplified output to a bipolar signal.

Preferably, the variable resistor device comprises a plurality of resistors connected in series with each other, and a selecting circuit that selects voltages at junctions between the plurality of resistors based on the externally supplied signal.

Also preferably, the electronic volume circuit according to the present invention comprises a capacitor connected to an input signal source having an end, that supplies the input signal, and a DC voltage source that supplies a predetermined fixed DC voltage, and the first amplifying circuit comprises an operational amplifier that operates as an inverting amplifier, the operational amplifier having a non-inverting input thereof connected to the end of the input signal source through the capacitor as well as to the DC voltage source, and the second amplifying circuit comprises a differential amplifier that amplifies a difference between an output from the operational amplifier and a signal applied to the non-inverting input of the operational amplifier.

According to this construction, the electronic volume circuit can be free of noise derived from grounding resistance.

Further preferably, the electronic volume circuit according to the present invention further comprises a third amplifying circuit that shunts a current flowing to the variable resistor device.

According to this construction, an electronic volume circuit is provided which can implement high-gain and hence multilevel control using low-gain amplifiers.

The above and other objects, features and advantages of the invention will become apparent from the following detailed description taken in conjunction with the accompanying drawings.

DETAILED DESCRIPTION OF THE PREFERRED EMBODIMENTS

The present invention will now be described in detail with reference to drawings showing embodiments thereof.

Figure 2:
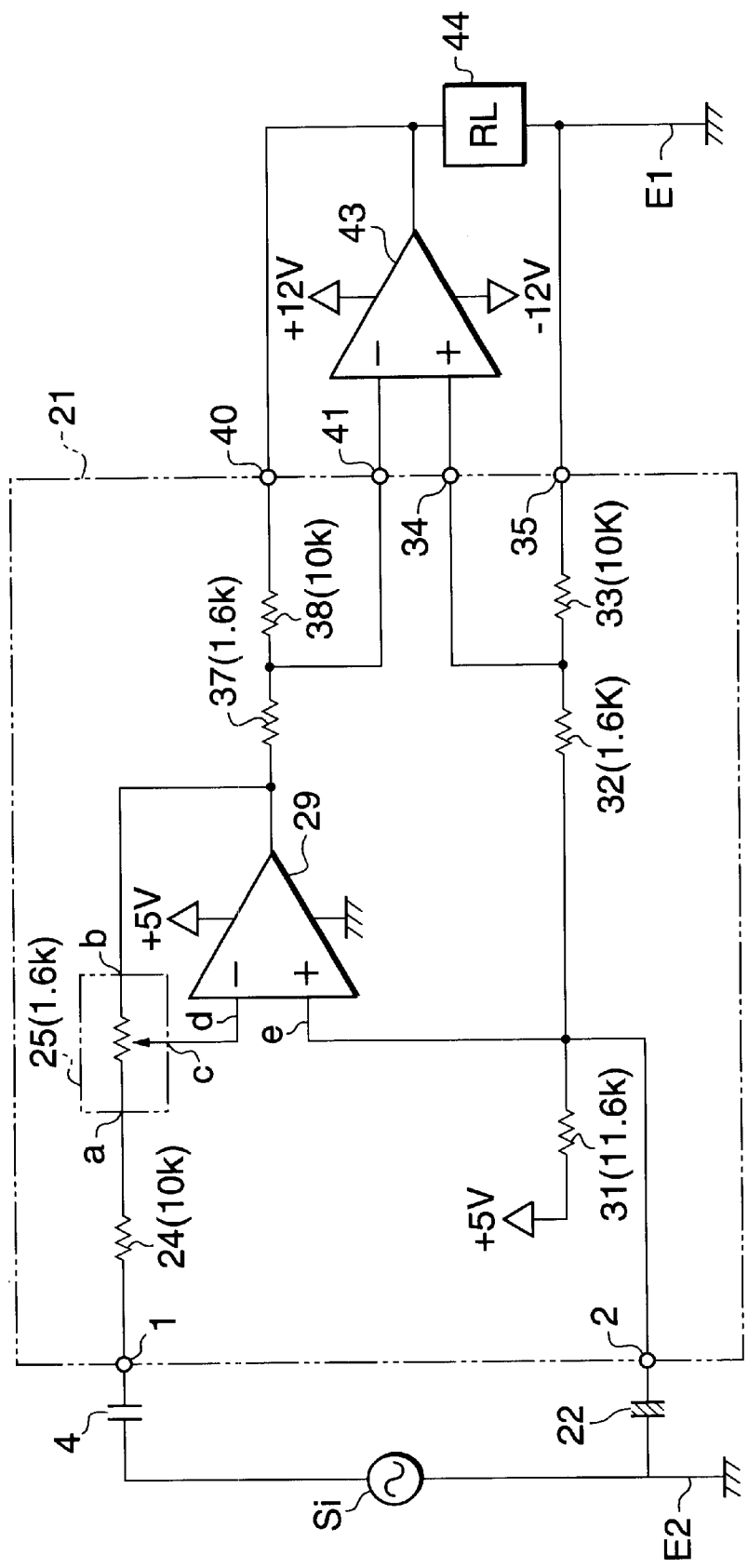
FIG. 2 is a circuit diagram showing the construction of an electronic volume circuit according to a first embodiment of the invention.

FIG. 2 is a circuit diagram showing the construction of an electronic volume circuit 21 according to a first embodiment of the invention. In the figure, symbol Si designates an input signal source that supplies input a signal Si varying at a maximum amplitude of ±12V. One end of the source Si is connected to an input terminal 1 via a DC cutoff capacitor 4, and the other end thereof is grounded. Further, an input terminal 2 is grounded via a stabilizing capacitor 22. One end of a resistor 24 (value 10 kΩ) is connected to the input terminal 1 and the other end thereof is connected to a terminal a of a variable resistor circuit 25 (value 1.6 kΩ).

Figure 3:
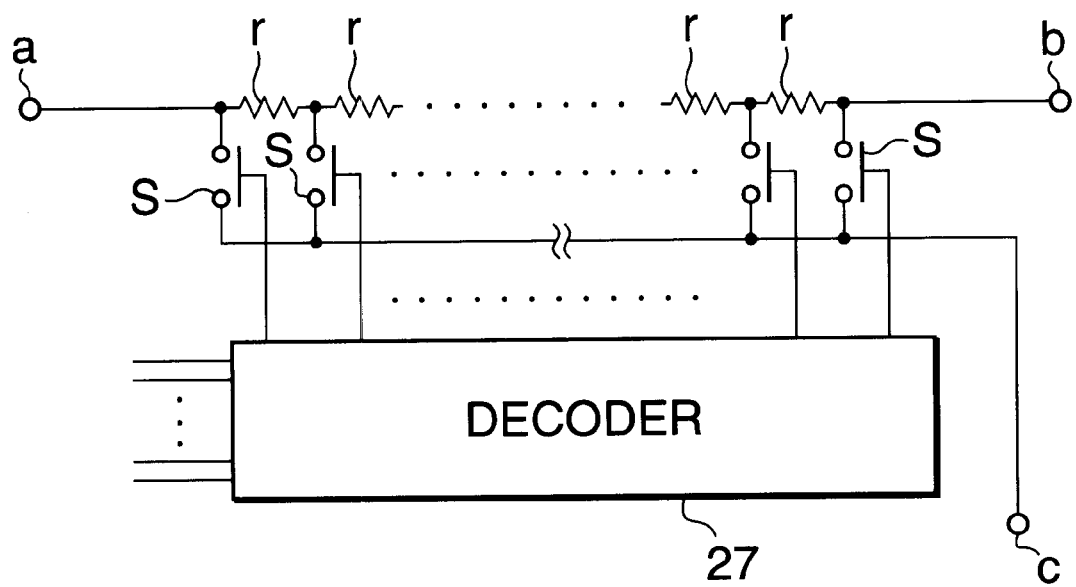
FIG. 3 is a circuit diagram showing the construction of a variable resistor circuit 25 of the first embodiment.

As shown in FIG. 3, this variable resistor circuit 25 is comprised of a string of 255 serially connected resistors r, a string of switches S each formed of an FET and connected at one end thereof to a corresponding one of the junctions between the resistors r and at the other end thereof connected together to a common junction, and a decoder 27 that carries out on/off control of the switches S. In the illustrated embodiment, the combined resistance value of the resistors r is 1.6 kΩ. One end of the serially connected resistors r is connected to the terminal a and the other end thereof to a terminal b, while the common junction of the switches S is connected to a terminal c. When the decoder 27 receives 8-bit volume control data from an external control circuit, at its control terminal, one of the switches S corresponding to the data is turned on, and the voltage at the junction to which one end of the switch S in question is connected is output through the terminal c.

The terminals c and b of the variable resistor circuit 25 are connected to an inverting input and an output of an operational amplifier 29, respectively. The operational amplifier 29 is of such a type as to be operated by a single power source (+5V), and a non-inverting input thereof is connected to the input terminal 2, as well as to a junction between a resistor 31 (value 11.6 kΩ) and a resistor 32 (value 1.6 kΩ). Further, the other end of the resistor 31 is connected to a power terminal (+5V), while the other end of the resistor 32 is connected to a terminal 34 and one end of a resistor 33 (value 10 kΩ). The other end of the resistor 33 is connected to a terminal 35.

Further, connected to the output of the operational amplifier 29 is one end of a resistor 37 (value 1.6 kΩ) the other end of which is connected to a terminal 41 and one end of a resistor 38 (value 10 kΩ). The other end of the resistor 38 is connected to a terminal 40.

The electronic volume circuit 21 constructed as above has its terminals 40, 41 and 34 connected, respectively, to an output, an inverting input and a non-inverting input of an externally attached operational amplifier 43. In the illustrated embodiment, the operational amplifier 43 is such a type as to be operated by two power sources of ±12V. The terminal 35 is grounded, and a load 44 is connected between the output of the operational amplifier 43 and ground to which the terminal 35 is connected. By connecting the electronic volume circuit 21 and the operational amplifier 43 in this manner, the voltage applied to the load 44 can be varied within a range of ±0 to ±12V according to the volume control data supplied to the variable resistor circuit 25 from outside when the input signal Si oscillates with an amplitude of ±12V.

The operation of the thus constructed electronic volume circuit will now be described. First, as the voltage at the non-inverting input e of the operational amplifier 29 is 2.5V, since +5V is applied to the other end of the resistor 31 and the terminal 35 is grounded. Therefore, the voltage at the inverting input (the voltage at the terminal c of the variable resistor circuit 25) likewise is 2.5V. If the peak-to-peak voltage of the input signal Si is ±12V, the signal at the input terminal 1 is shifted by the voltage at the inverting input d, and the voltage at the input terminal 1 thus becomes as follows:

Voltage at input terminal 1=2.5V±12V

Next, let us consider the voltage at the terminal a of the variable resistor circuit 25. First, when the terminal c is connected to the terminal a, the terminal a=2.5V, which is fixed even if the input signal Si varies. On the other hand, when the terminal c is connected to the terminal b, the voltage at the terminal b becomes 2.5V, whereby the voltage at the terminal a becomes (2.5V+1.66V) when the voltage at the input terminal 1 is (2.5V+12V), and (2.5V−1.66V) when the voltage at the terminal 1 is (2.5V−12V). That is, the voltage at the terminal a becomes as follows:

c=a→a=2.5V (fixed)

c=b→a=2.5V±1.66V

Next, the output voltage of the operational amplifier 29 becomes 2.5V when the terminal c is connected to the terminal b, and this value is fixed even if the input signal Si varies. On the other hand, when the terminal c is connected to the terminal a, the voltage at the terminal a becomes 2.5V, whereby the output voltage of the amplifier 29 becomes (2.5V−1.92V) when the voltage at the input terminal 1 is (2.5V+12V), and (2.5V+1.92V) when the voltage at the terminal 1 is (2.5V−12V). That is, the output voltage of the operational amplifier 29 becomes as follows:

c=a→Output 29=2.5V±1.92V c=b→Output 29=2.5V (fixed)

In this manner, when the input signal Si oscillates with an amplitude of ±12V, the output voltage of the operational amplifier 29 assumes a fixed voltage of 2.5V if the terminal c of the variable resistor circuit 25 is connected to the terminal b, i.e. if the volume is minimized, while the same voltage varies within the range of 2.5±1.92V if the terminal c is connected to the terminal a, i.e. if the volume is maximized.

As described above, the electronic volume circuit 21 according to this embodiment attenuates the input signal Si to a level corresponding to the volume control data applied to the variable resistor circuit 25 and outputs a signal as a unipolar signal.

Next, the voltage at the terminal 34 is 2.155V since it is obtained by dividing the +5V source voltage by the resistors 31, 32 and 33, and hence the voltage at the terminal 41 is also 2.155V. Therefore, when the output voltage of the operational amplifier 29 is (2.5V−1.92V), the resistance values of the resistors 37 and 38 are 1.6 kΩ and 10 kΩ, respectively, whereby the output voltage of the operational amplifier 43 becomes +12V. Further, when the output voltage of the operational amplifier 29 is (2.5V+1.92V), the output voltage of the operational amplifier 43 becomes −12V. That is, when the terminal c of the variable resistor circuit 25 is connected to the terminal a, the output voltage of the operational amplifier 43 becomes as follows:

Voltage at input terminal 1=(2.5V+12V)→+12V

Voltage at input terminal 1=(2.5V−12V)→−12V

On the other hand, when the terminal c of the variable resistor circuit 25 is connected to the terminal b, the output voltage of the operational amplifier 43 becomes 0 for any input signal.

Thus, according to the electronic volume circuit of this embodiment, the output voltage of the operational amplifier 29 is varied within the range of 2.5V±1.92V according to the volume control data applied to the variable resistor circuit 25 when the input signal Si oscillates within the range of ±12V, and the output voltage of the operational amplifier 43 is varied within the range of ±0 to ±12V.

As described above, the electronic volume circuit 21 according to this embodiment is operated by a single 5V power source, and can therefore be formed by an LSI that can be prepared in a simple manner using an oxide film and a junction process for a single 5V power source. Further, in the case of an ordinary LSI for a 5V power source, its input terminal is provided with a protective circuit to prevent the application of a high voltage of 5V or higher thereto. Unlike this, according to the construction of FIG. 2, even when a high voltage of 5V or higher, e.g. ±12V, is applied to its input terminal 1, the resistors 24 and 25 reduce such a high voltage, whereby the operational amplifier 29 will never receive a voltage of 5V or higher. Therefore, there is no need to provide the input terminal 1 with any special protective circuit, and as a result, voltages of ±12V can be applied to the input terminal 1.

Further, according to the above construction, a reference signal of 0V can be used as a DC reference voltage of the electronic volume.

Further, according to the above construction, the grounding terminal 35 is provided on the output side, while the non-inverting input terminal of the operational amplifier 29 is connected to the terminal 2 provided on the input side, and the terminal 2 is alternating current-grounded through the capacitor 22. This arrangement provides the advantage of preventing the occurrence of noise due to grounding resistance. That is, in FIG. 2, it is impossible to arrange the output-side grounding point E1 and the input-side grounding point E2 at the same location from the component layout viewpoint, and hence they should necessarily be arranged at different locations. In such a case, a current flows through a very small ground resistance between the points E1 and E2, inducing noise voltage. However, according to the arrangement of this embodiment shown in FIG. 2, induced noise voltage components are applied in phase to both input terminals of the operational amplifier 43, and hence no noise attributable to this ground return current appears at the output of the same amplifier 43. Therefore, the above arrangement provides the advantage of enabling designing the circuit component layout without giving considerations to the noise caused by the grounding resistance.

Figure 1:
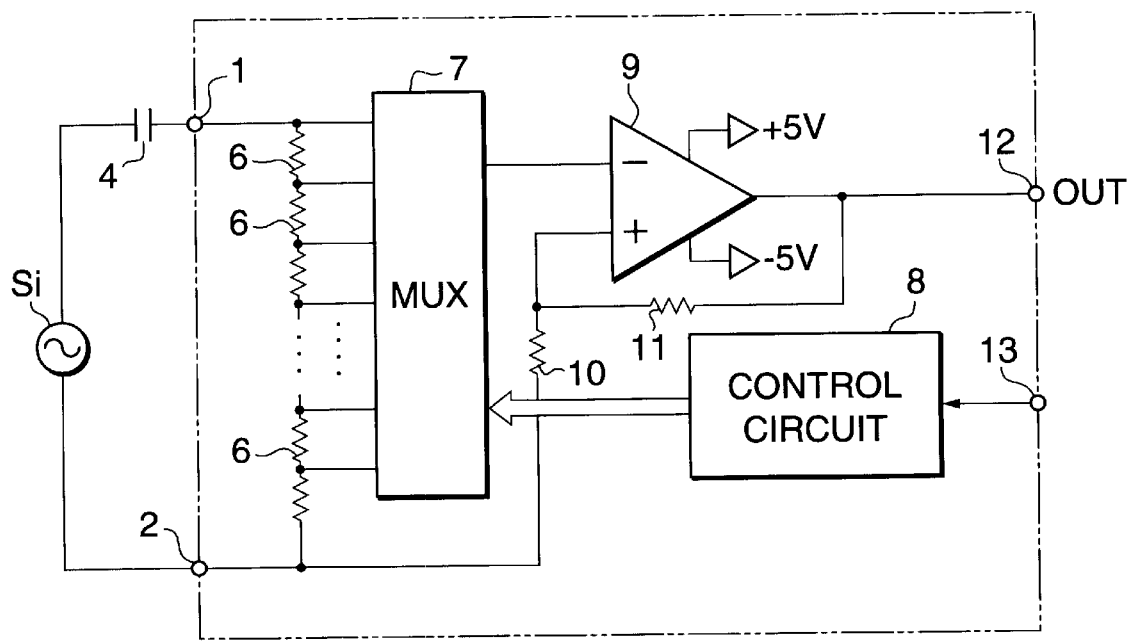
FIG. 1 is a block diagram showing an example of the arrangement of a conventional electronic volume circuit.

When volume control over 256 levels (8 bits 128 dB) is to be performed at intervals of 0.5 dB using the above described electronic volume circuit of FIG. 1, the operational amplifier 29 needs to have a gain of −144 dB (=−16−128) when the volume is minimized, since the maximum gain of the operational amplifier 29 is −16 dB. To allow for some margin, the operational amplifier 29 needs to have a gain of about −150 dB. However, ordinary operational amplifiers provide only a gain of −90 dB or so, and thus, if the electronic volume circuit of FIG. 2 is constructed of one of such ordinary operational amplifiers, the same circuit cannot cause a required amount of current to flow properly to the output of the operational amplifier 29 from its input terminal 1. As a solution to this problem, a second embodiment of the present invention will now be described.

Figure 4:
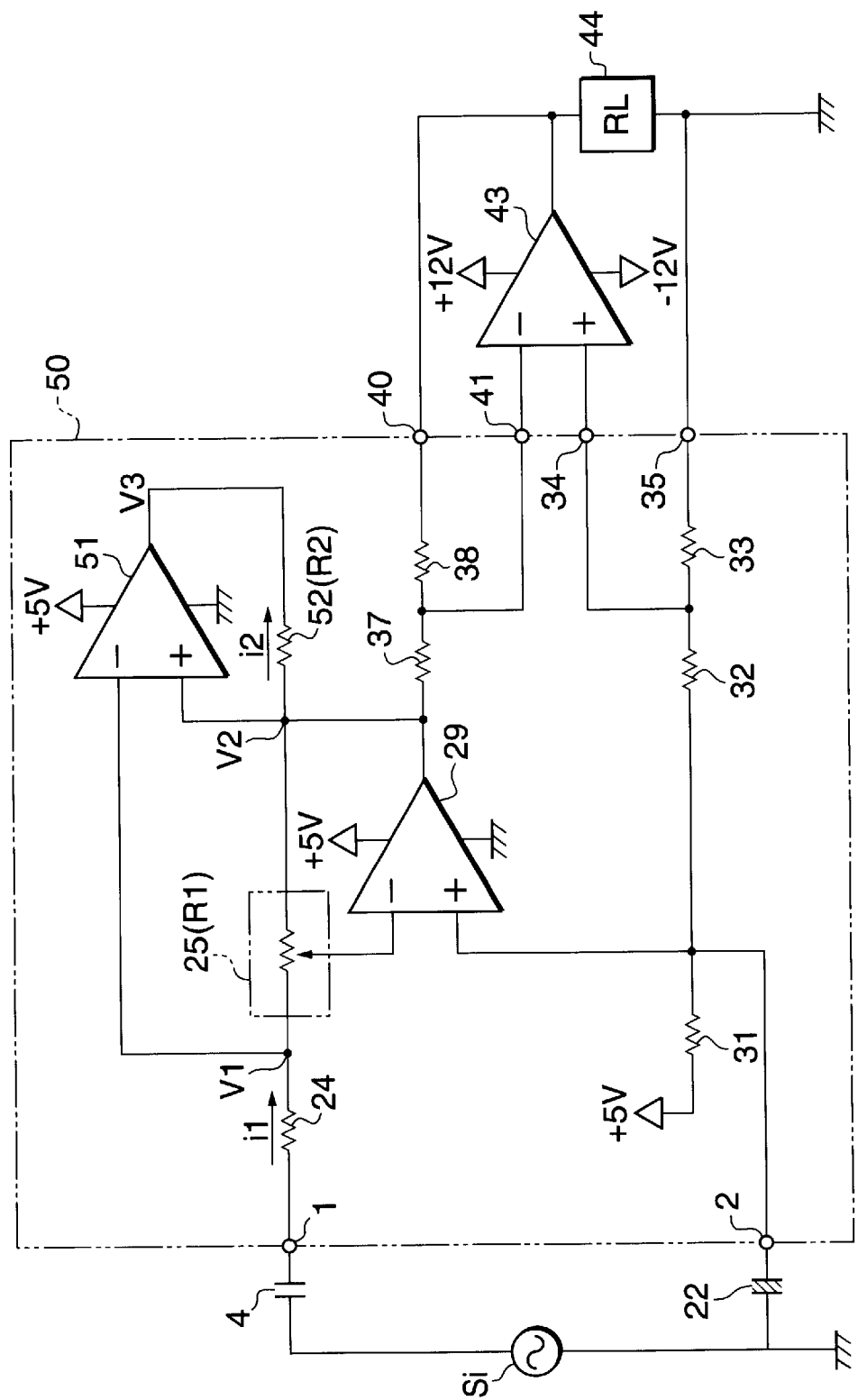
FIG. 4 is a circuit diagram showing the construction of a second embodiment of the invention.

FIG. 4 is a circuit diagram showing the construction of an electronic volume circuit 50 according to the second embodiment. The electronic volume circuit 50 shown in the figure is different from the electronic volume circuit 21 shown in FIG. 2 in that the former is provided with an amplifier 51 and a resistor 52 connected between a non-inverting input and an output of the amplifier 51. In the illustrated embodiment, the gain of the amplifier 51 is set to R2/R1 provided that the resistance value of the variable resistor circuit 25 is designated by R1 and that of the resistor 52 R2.

In the above arrangement, if the current flowing from the input terminal 1 is designated by i1, the current flowing to the amplifier 51 via the resistor 52 i2, the voltage at the junction between the resistor 24 and the variable resistor circuit 25 V1, the voltage at the junction between the variable resistor circuit 25 and the resistor 52 V2, and the output voltage of the amplifier 51 V3, the following relationship is established:

$V3-V2=(R2/R1)\,(V2-V1)$ $V2-V1=-i1\times R1$ $V3-V2=-i2\times R2$

From these three equations, the following equation is obtained:

$i2=i1$

That is, according to the construction of FIG. 4, a major part of the current flowing from the input terminal 1 flows into the amplifier 51 (feed-forward control), and therefore, even a commercially available operational amplifier 29 can implement sufficient control.

Figure 5:
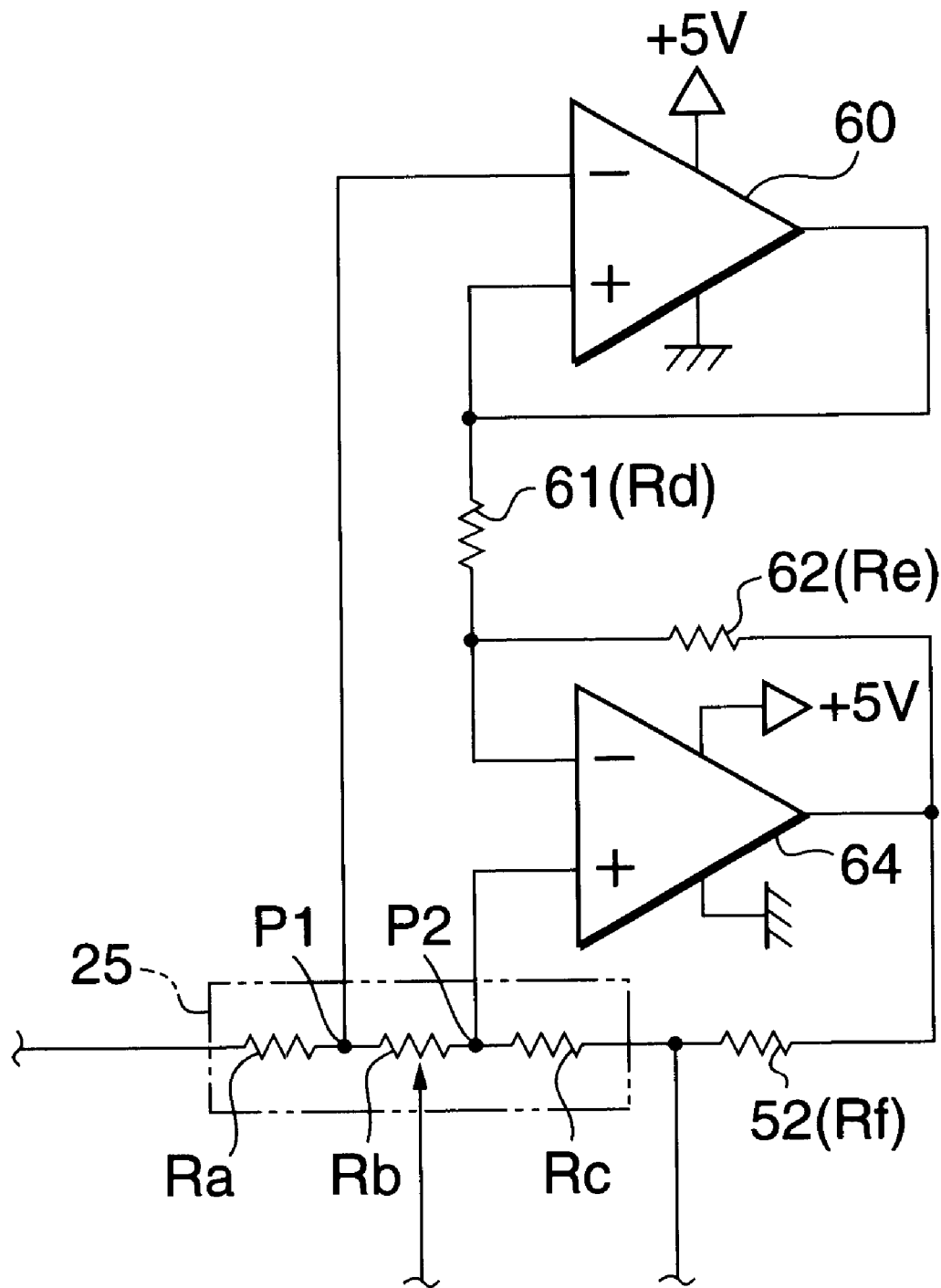
FIG. 5 is a circuit diagram showing a specific example of the construction of an amplifier 51 of the second embodiment.

FIG. 5 is a circuit diagram showing a specific example of the construction of the above-mentioned amplifier 51. In the figure, the amplifier 51 is comprised of an operational amplifier 60 which is a non-inverting amplifier having a gain of 1, resistors 61 and 62 (values Rd and Re), and an operational amplifier 64. An inverting input of the operational amplifier 60 and a non-inverting input of the operational amplifier 64 are connected to intermediate points (junctions) P1 and P2 of the variable resistor circuit 25, respectively. If the resistance value between the intermediate point P1 and an input-side end of the variable resistor circuit 25 is designated by Ra, the resistance value between the intermediate points P1 and P2 Rb, and the resistance value between the intermediate point P2 and an outputside end of the circuit 25 Rc, the resistance values Rd and Re of the resistors 61 and 62 are set such that the following relationship is satisfied:

$Re/Rd=(Rc+Rf)/Rb$

For example, the respective resistance values are set as follows:

Ra =600Ω, Rb=300Ω, Rc=700Ω, Rd=6 kΩ, Re 18 kΩ, Rf=200Ω

The performance of this circuit depends upon the relative difference between the resistors. A relative difference of 0.1% or less can be realized.

$0.1\% \rightarrow 20\log 1000 = 60$ (dB)

Thus, the gain can be increased by about 60 dB. As a result, the function described with reference to FIG. 4 can be achieved. The reason why the inverting input and the non-inverting input of the operational amplifiers 60 and 64 are not connected to both ends of the variable resistor circuit 25 but connected to its intermediate points, respectively, is that the operational amplifiers can receive a rather narrow range of in-phase input components so that reduced voltages need to be applied.

What is claimed is:

1. An electronic volume circuit comprising:
   a first amplifying circuit that attenuates amplitude of a bipolar input signal and converts the attenuated input signal to a unipolar signal;
   a variable resistor device that controls a degree of attenuation of said first amplifying circuit based on an externally supplied signal; and
   a second amplifying circuit that amplifies an output from said first amplifying circuit and converts the amplified output to a bipolar signal.

2. An electronic volume circuit comprising:
   a first amplifying circuit to attenuate amplitude of a bipolar input signal and convert the attenuated input signal to a unipolar signal; and
   a variable resistor device to control a degree of attenuation of the first amplifying circuit based on an externally supplied signal,
   wherein said variable resistor device comprises a plurality of resistors connected in series with each other, and a selecting circuit that selects voltages at junctions between said plurality of resistors based on said externally supplied signal.

3. The electronic volume circuit according to claim 1, wherein said variable resistor device comprises a plurality of resistors connected in series with each other, and a selecting circuit that selects voltages at junctions between said plurality of resistors based on said externally supplied signal.

4. The electronic volume circuit according to claim 1, further comprising a capacitor connected to an input signal source having an end that supplies said input signal, and a DC voltage source that supplies a predetermined fixed DC voltage,
   wherein said first amplifying circuit comprises an operational amplifier that operates as an inverting amplifier, said operational amplifier having a non-inverting input thereof connected to said end of said input signal source through said capacitor as well as to said DC voltage source, and
   said second amplifying circuit comprises a differential amplifier that amplifies a difference between an output from said operational amplifier and a signal applied to said non-inverting input of said operational amplifier.

5. An electronic volume circuit comprising:
   a first amplifying circuit to attenuate amplitude of a bipolar input signal and convert the attenuated input signal to a unipolar signal;
   a variable resistor device to control a degree of attenuation of the first amplifying circuit based on an externally supplied signal; and
   a third amplifying circuit that shunts a current flowing to said variable resistor device.

6. An electronic volume circuit according to claim 1, further comprising a third amplifying circuit that shunts a current flowing to said variable resistor device.

* * * * *